US012666614B2

(12) United States Patent (10) Patent No.: US 12,666,614 B2
Carnevale (45) Date of Patent: Jun. 23, 2026

(54) PILLAR MEMORY DEVICE HAVING A HOLLOW CENTRAL REGION AND METHOD FOR MANUFACTURING THE SAME

(71) Applicant: Micron Technology, Inc., Boise, ID (US)

(72) Inventor: Gianpietro Carnevale, Bottanuco (IT)

(73) Assignee: Micron Technology, Inc., Boise, ID (US)

( * ) Notice: Subject to any disclaimer, the term of this patent is extended or adjusted under 35 U.S.C. 154(b) by 391 days.

(21) Appl. No.: 17/711,620

(22) Filed: Apr. 1, 2022

(65) Prior Publication Data

US 2023/0320090 A1 Oct. 5, 2023

(51) Int. Cl.
H10B 43/27 (2023.01)
H10B 41/27 (2023.01)

(52) U.S. Cl.
CPC ............. H10B 43/27 (2023.02); H10B 41/27 (2023.02)

(58) Field of Classification Search
CPC ....... H10B 43/27; H10B 41/27; H01L 21/764; H01L 29/40117; H01L 29/7889; H01L 29/7926
See application file for complete search history.

(56) References Cited

U.S. PATENT DOCUMENTS

| 2003/0146470 A1* | 8/2003 | Hijzen | H10D 8/60 |
| | | | 257/E29.136 |
| 2012/0001247 A1* | 1/2012 | Alsmeier | H10D 30/693 |
| | | | 257/314 |
| 2017/0263623 A1* | 9/2017 | Zhang | H01L 21/02636 |
| 2019/0333934 A1* | 10/2019 | Dorhout | H10D 30/025 |
| 2023/0041476 A1* | 2/2023 | Yang | G11C 16/3495 |
| 2023/0064982 A1* | 3/2023 | Shiga | G11C 13/0038 |

OTHER PUBLICATIONS

Mcnabney, R. et al., The Dielectric Constants of Air and Hydrogen at High Pressure, Physical Review 47, p. 695-698, 1935 (Year: 1935).*

* cited by examiner

*Primary Examiner* — Wael M Fahmy
*Assistant Examiner* — Tiberiu Dan Onuta
(74) *Attorney, Agent, or Firm* — Schwegman Lundberg & Woessner, P.A.

(57) ABSTRACT

Apparatus and methods are disclosed, including memory devices and systems. Example memory devices, systems and methods include memory strings with a conductor channel shell and a low dielectric constant central region. In one example, memory devices, systems and methods include memory strings with a conductor channel shell and a hollow central region.

13 Claims, 8 Drawing Sheets

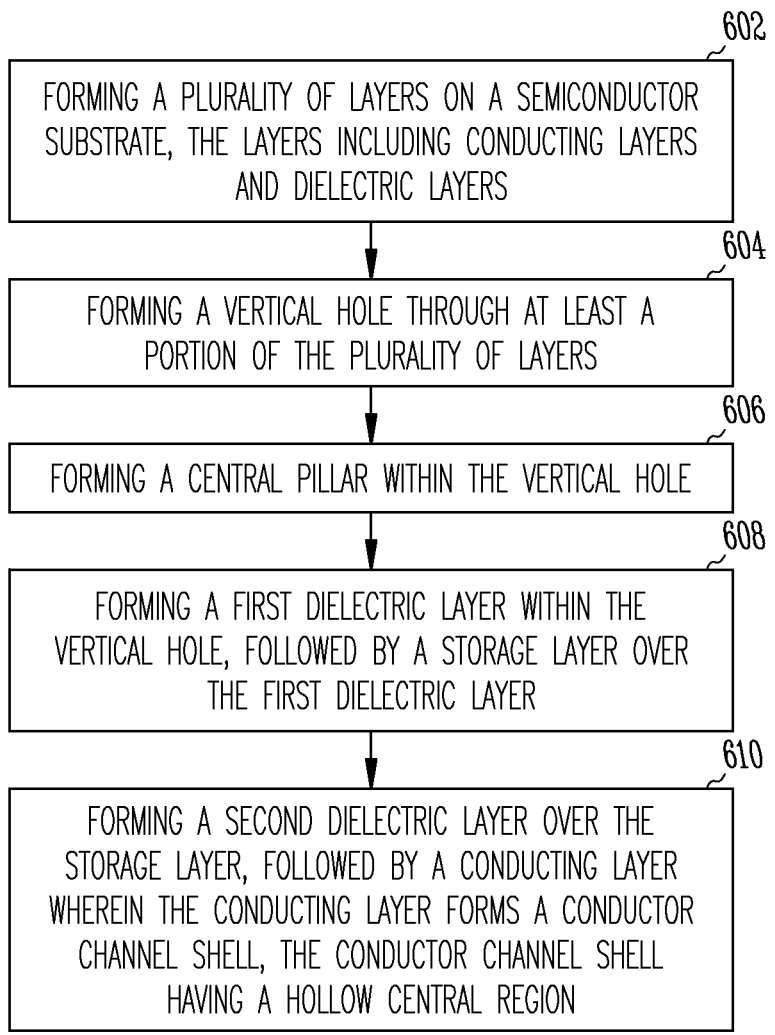

602

FORMING A PLURALITY OF LAYERS ON A SEMICONDUCTOR SUBSTRATE, THE LAYERS INCLUDING CONDUCTING LAYERS AND DIELECTRIC LAYERS

604

FORMING A VERTICAL HOLE THROUGH AT LEAST A PORTION OF THE PLURALITY OF LAYERS

606

FORMING A CENTRAL PILLAR WITHIN THE VERTICAL HOLE

608

FORMING A FIRST DIELECTRIC LAYER WITHIN THE VERTICAL HOLE, FOLLOWED BY A STORAGE LAYER OVER THE FIRST DIELECTRIC LAYER

610

FORMING A SECOND DIELECTRIC LAYER OVER THE STORAGE LAYER, FOLLOWED BY A CONDUCTING LAYER WHEREIN THE CONDUCTING LAYER FORMS A CONDUCTOR CHANNEL SHELL, THE CONDUCTOR CHANNEL SHELL HAVING A HOLLOW CENTRAL REGION

*Fig. 6*

PILLAR MEMORY DEVICE HAVING A HOLLOW CENTRAL REGION AND METHOD FOR MANUFACTURING THE SAME

BACKGROUND

Memory devices are semiconductor circuits that provide electronic storage of data for a host system (e.g., a computer or other electronic device). Memory devices may be volatile or non-volatile. Volatile memory requires power to maintain data, and includes devices such as random-access memory (RAM), static random-access memory (SRAM), dynamic random-access memory (DRAM), or synchronous dynamic random-access memory (SDRAM), among others. Non-volatile memory can retain stored data when not powered, and includes devices such as flash memory, read-only memory (ROM), electrically erasable programmable ROM (EEPROM), erasable programmable ROM (EPROM), resistance variable memory, such as phase change random access memory (PCRAM), resistive random-access memory (RRAM), or magnetoresistive random access memory (MRAM), among others.

Host systems typically include a host processor, a first amount of main memory (e.g., often volatile memory, such as DRAM) to support the host processor, and one or more storage systems (e.g., often non-volatile memory, such as flash memory) that provide additional storage to retain data in addition to or separate from the main memory.

A storage system, such as a solid-state drive (SSD), can include a memory controller and one or more memory devices, including a number of dies or logical units (LUNs). In certain examples, each die can include a number of memory arrays and peripheral circuitry thereon, such as die logic or a die processor. The memory controller can include interface circuitry configured to communicate with a host device (e.g., the host processor or interface circuitry) through a communication interface (e.g., a bidirectional parallel or serial communication interface). The memory controller can receive commands or operations from the host system in association with memory operations or instructions, such as read or write operations to transfer data (e.g., user data and associated integrity data, such as error data or address data, etc.) between the memory devices and the host device, erase operations to erase data from the memory devices, perform drive management operations (e.g., data migration, garbage collection, block retirement), etc.

The present description relates generally to example structures and associated methods for vertical stacked memory cells, strings, and arrays.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIG. 6 illustrates an example method flow diagram in accordance with other example embodiments.

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Figure 1:
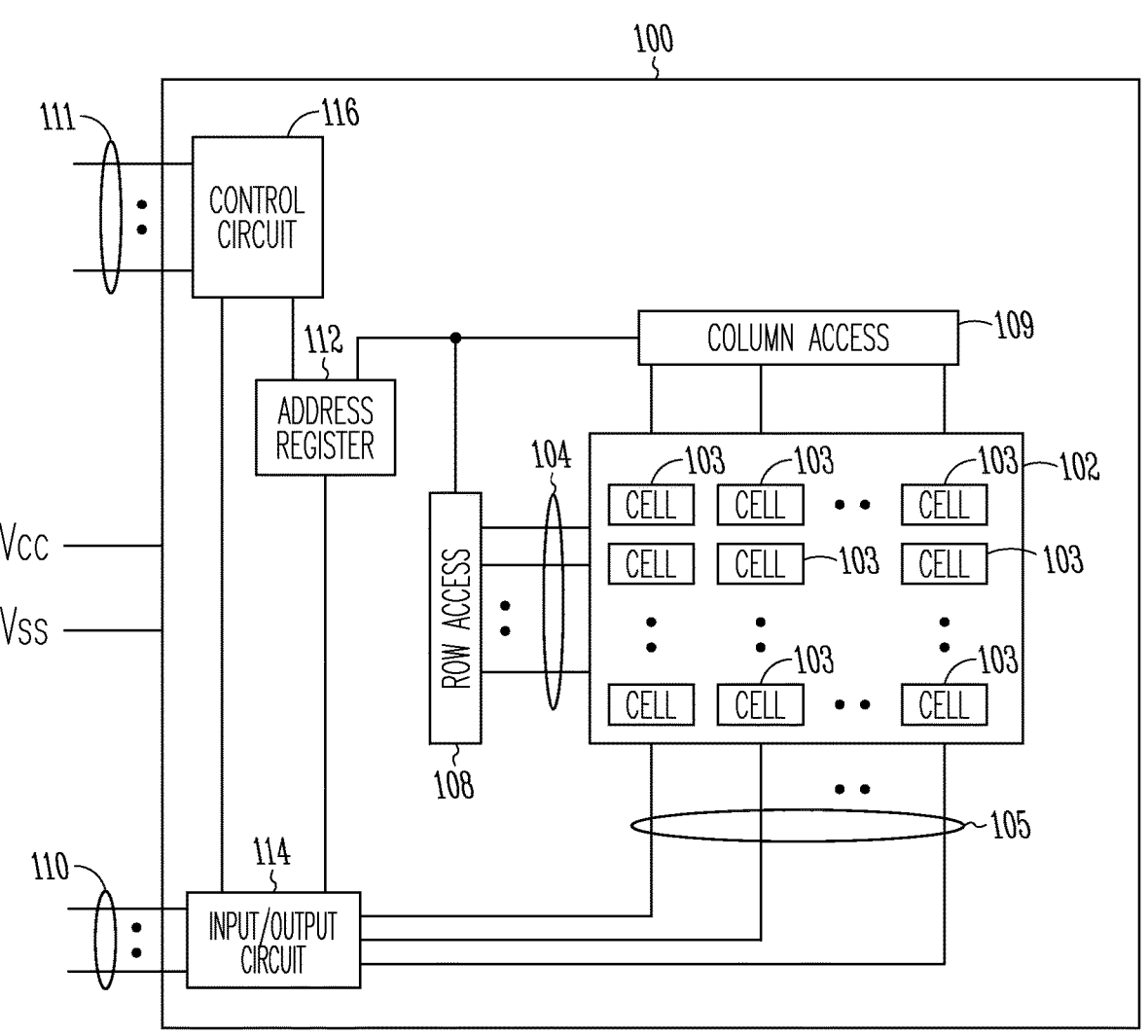
FIG. 1 illustrates a memory device in accordance with some example embodiments.

FIG. 1 shows a block diagram of an apparatus in the form of a memory device 100, according to an embodiment of the invention. Memory device 100 can include a memory array 102 having memory cells 103 that can be arranged in rows and columns along with lines (e.g., access lines) 104 and lines (e.g., data lines) 105. In one example, memory cells 103 are arranged in memory strings that are further arranged in rows and columns. Memory device 100 can use lines 104 to access memory cells 103 and lines 105 to exchange information with memory cells 103.

Row access 108 and column access 109 circuitry can respond to an address register 112 to access memory cells 103 based on row address and column address signals on lines 110, 111, or both. A data input/output circuit 114 can be configured to exchange information between memory cells 103 and lines 110. Lines 110 and 111 can include nodes within memory device 100 or pins (or solder balls) on a package where memory device 100 can reside.

A control circuit 116 can control operations of memory device 100 based on signals present on lines 110 and 111. A device (e.g., a processor or a memory controller) external to memory device 100 can send different commands (e.g., read, write, or erase commands) to memory device 100 using different combinations of signals on lines 110, 111, or both.

Memory device 100 can respond to commands to perform memory operations on memory cells 103, such as performing a read operation to read information from memory cells 103 or performing a write (e.g., programming) operation to store (e.g., program) information into memory cells 103. Memory device 100 can also perform an erase operation to clear information from some or all of memory cells 103.

Memory device 100 can receive a supply voltage, including supply voltages Vcc and Vss. Supply voltage Vss can operate at a ground potential (e.g., having a value of approximately zero volts). Supply voltage Vcc can include an external voltage supplied to memory device 100 from an external power source such as a battery or an alternating-current to direct-current (AC-DC) converter circuitry.

Each of memory cells 103 can be programmed to store information representing a value of a fraction of a bit, a value of a single bit, or a value of multiple bits such as two, three, four, or another number of bits. For example, each of memory cells 103 can be programmed to store information representing a binary value "0" or "1" of a single bit. The single bit per cell is sometimes called a single level cell. In another example, each of memory cells 103 can be programmed to store information representing a value for multiple bits, such as one of four possible values "00," "01," "10," and "11" of two bits, one of eight possible values "000," "001," "010," "011," "100," "101," "110," and "111" of three bits, or one of other values of another number of multiple bits. A cell that has the ability to store multiple bits is sometimes called a multi-level cell (or multi-state cell).

Memory device 100 can include a non-volatile memory device, and memory cells 103 can include non-volatile memory cells, such that memory cells 103 can retain information stored thereon when power (e.g., Vcc, Vss, or both) is disconnected from memory device 100. For example, memory device 100 can be a flash memory device, such as a NAND flash or a NOR flash memory device, or another kind of memory device, such as a variable resistance memory device (e.g., a phase change or resistive RAM device).

Memory device 100 can include a memory device where memory cells 103 can be physically located in multiple levels on the same device, such that some of memory cells 103 can be stacked over some other memory cells 103 in multiple levels over a substrate (e.g., a semiconductor substrate) of memory device 100.

One of ordinary skill in the art may recognize that memory device 100 may include other elements, several of which are not shown in FIG. 1, so as not to obscure the example embodiments described herein.

Figure 2A:
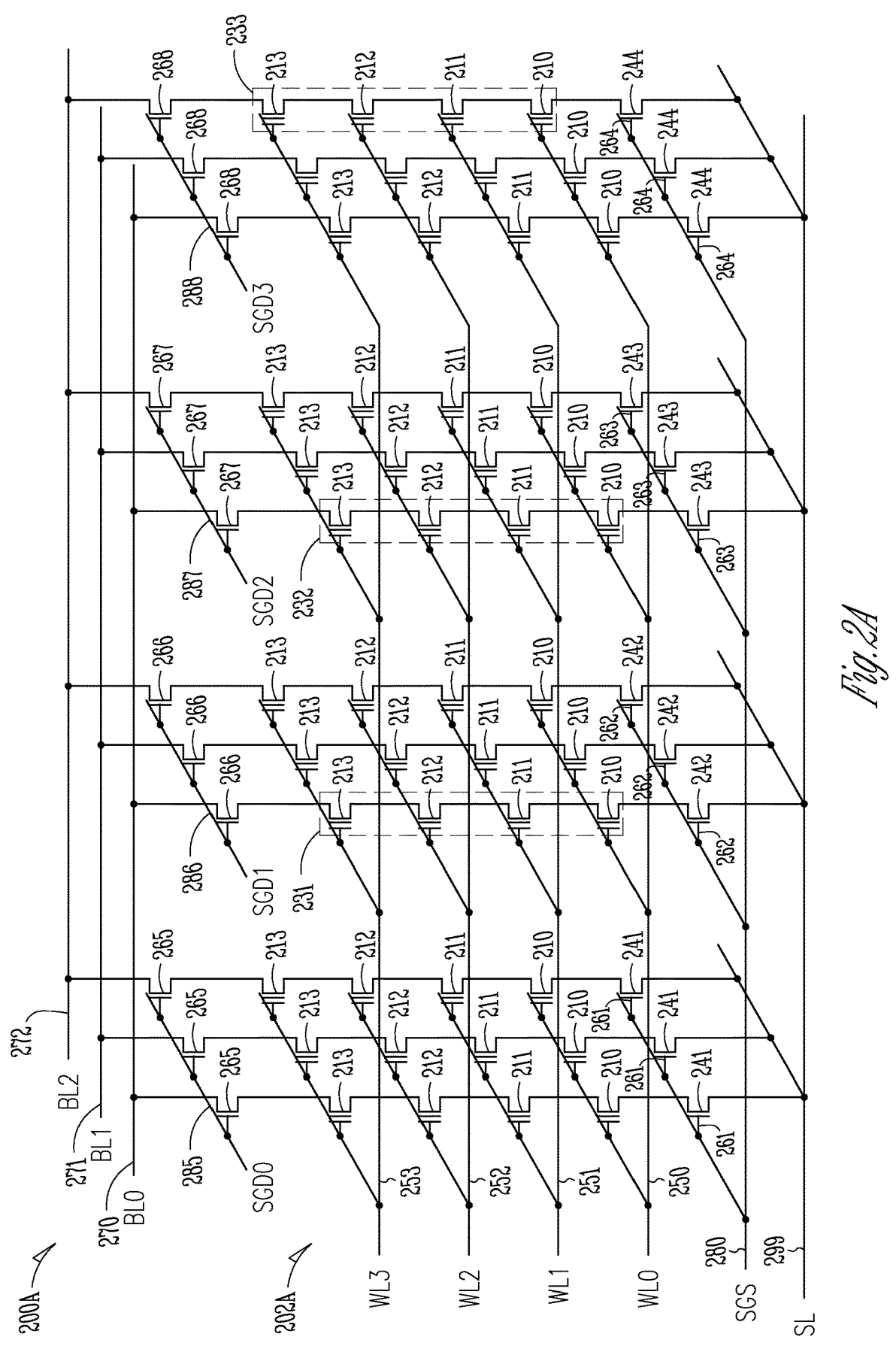
FIG. 2A illustrates a memory array including a memory string in accordance with some example embodiments.

FIG. 2A shows a schematic diagram of a portion of a memory device 200A having a memory array 202A with a gate 280 (e.g., a shared bottom source select gate), according to an embodiment of the invention. Gate 280 can form part of a select line (e.g., source select line) of memory device 200A. Memory device 200A can include control gates 250, 251, 252, and 253 that can carry corresponding signals WL0, WL1, WL2, and WL3. Each of control gates 250, 251, 252, and 253 can form part of a respective access line of memory device 200A. Memory device 200A can include lines 270, 271, and 272 that carry signals BL0, BL1, and BL2, respectively. Each of lines 270, 271, and 272 can form part of a respective data line of memory device 200A. FIG. 2A shows four control gates 250, 251, 252, and 253 and three lines 270, 271, and 272 as an example. The number of such control gates and lines can vary.

Memory device 200A can include memory cells 210, 211, 212, and 213, and transistors (e.g., select transistors) 261 through 268. Memory cells 210, 211, 212, and 213 can be arranged in memory cell strings, such as memory cell strings 231, 232, and 233. For simplicity, in FIG. 2A, only three of the memory cell strings are labeled (231, 232, and 233).

Each memory cell string in memory device 200A can be coupled to two associated transistors among transistors 261 through 268. For example, memory cell string 231 can be coupled to transistor 262 (directly under string 231) and transistor 266 (directly over string 231).

FIG. 2A shows an example of twelve memory cell strings and four memory cells 210, 211, 212, and 213 in each memory cell string. The number of such memory cell strings and number of such memory cells in each memory cell string can vary.

As shown in FIG. 2A, transistors 261, 262, 263, and 264 can share the same gate 280. Thus, transistors 261, 262, 263, and 264 can be controlled (e.g., turned on or turned off) by the same signal, such as an SGS signal (e.g., source select gate signal) associated with gate 280. Transistors 261, 262, 263, and 264 can include body regions 241, 242, 243, and 244, respectively. During a memory operation, such as a read or write operation, transistors 261, 262, 263, and 264 and can be turned on (e.g., by activating an SGS signal) to couple the memory cell strings of memory device 200A to a line 299 through body regions 241, 242, 243, and 244. Transistors 261, 262, 263, and 264 can be turned off (e.g., by deactivating the SGS signal) to decouple the memory cell strings of memory device 200A from line 299. Line 299 can form part of a source (e.g., a source line) of memory device 200A and can carry a signal, such as signal SL (e.g., source line signal).

Transistors 265, 266, 267, and 268 can include separate gates (e.g., drain select gates) 285, 286, 287, and 288. However, transistors 265 can share the same gate 285. Transistors 266 can share the same gate 286. Transistors 267 can share the same gate 287. Transistors 268 can share the same gate 288. Each of gates 285, 286, 287, and 288 can form part of a respective select line (e.g., drain select line) of memory device 200A.

Transistors 265, 266, 267, and 268 and can be controlled (e.g., turned on or turned off) by corresponding SGD0, SGD1, SGD2, and SGD3 signals (e.g., drain select gate signals) in order to selectively couple the memory cell strings of memory device 200A to their respective lines 270, 271, and 272, during a memory operation, such as a read or write operation. For example, during a memory operation, the SGD1 signal can be activated to couple memory cell string 231 to line 270. The SGD0, SGD2, and SGD3 signals can be deactivated to decouple the other memory cell strings from line 270. During a memory operation (e.g., a read or write operation), only one of the SGD0, SGD1, SGD2, and SGD3 signals can be activated at a time.

Memory cells 210, 211, 212, and 213 can be physically located in multiple levels of memory device 200A, such that memory cells 210, 211, 212, and 213 in the same memory cell string can be stacked over each other in multiple levels of memory device 200A.

Figure 2B:
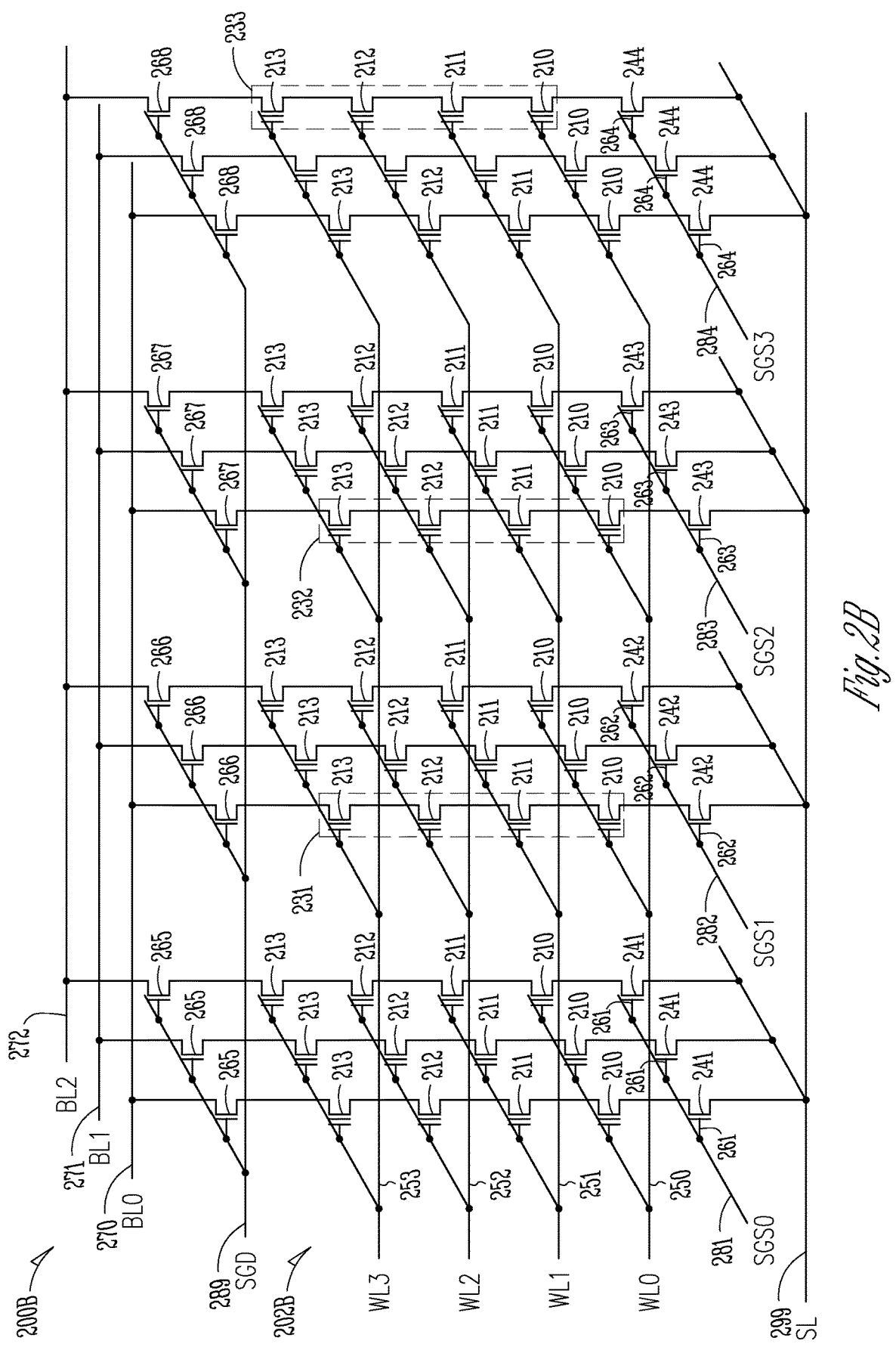
FIG. 2B illustrates another example of a memory array including a memory string in accordance with some example embodiments.

FIG. 2B shows a schematic diagram of a portion of a memory device 200B having a memory array 202B with a gate 289 (shared top drain select gate), according to an embodiment of the invention. Gate 289 can form part of a select line (e.g., drain select line) of memory device 200A. Memory device 200B includes elements that can be similar to or identical to those of memory device 200A of FIG. 2A. For simplicity, detailed description of similar or the identical elements between FIG. 2A and FIG. 2B is not repeated in the description of FIG. 2B.

As shown in FIG. 2B, transistors 265, 266, 267, and 268 can share the same gate 289. Thus, transistors 265, 266, 267, and 268 can be controlled (e.g., turned on or turned off) by the same signal, such as an SGD signal (e.g., source select gate signal) associated with gate 289. During a memory operation, such as a read or write operation, transistors 265, 266, 267, and 268 and can be turned on (e.g., by activating the SGD signal) to couple the memory cell strings of memory device 200B to their respective lines 270, 271, and 272. Transistors 265, 266, 267, and 268 and can be turned off (e.g., by deactivating the SGD signal) to decouple the memory cell strings of memory device 200B from lines 270, 271, and 272.

Transistors 261, 262, 263, and 264 can include separate gates (e.g., source select gates) 281, 282, 283, and 284. However, transistors 261 can share the same gate 281. Transistors 262 can share the same gate 282. Transistors 263 can share the same gate 283. Transistors 264 can share the same gate 284. Each of gates 281, 282, 283, and 284 can form part of a respective select line (e.g., source select line) of memory device 200A.

Transistors 261, 262, 263, and 264 and can be controlled (e.g., turned on or turned off) by corresponding SGS0, SGS1, SGS2, and SGS3 signals (e.g., source select gate signals) in order to selectively couple the memory cell strings of memory device 200B to line 299, during a memory operation, such as a read or write operation. For example, during a memory operation, the SGS1 signal can be activated to couple memory cell string 231 to line 299. The SGS0, SGS2, and SGS3 signals can be deactivated to decouple the other memory cell strings from line 299. During a memory operation (e.g., a read or write operation), only one of the SGS0, SGS1, SGS2, and SGS3 signals can be activated at a time.

Figure 3:
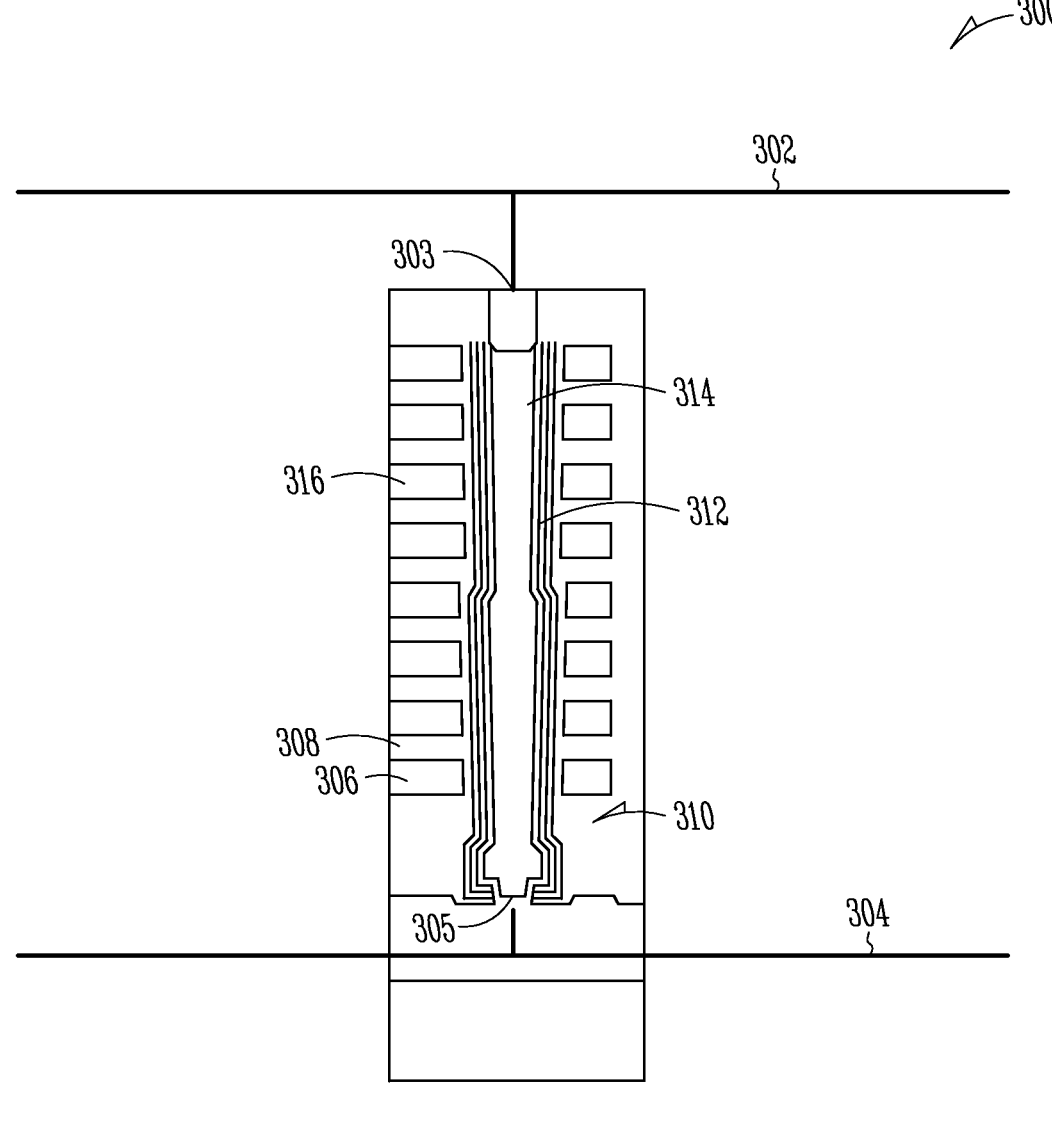
FIG. 3 illustrates a memory string in accordance with some example embodiments.

FIG. 3 shows an individual memory string 300 similar to memory strings 231 or 232 shown in FIGS. 2A and 2B. Memory string 300 includes a central pillar 310 including a conductor channel shell 312. In the example of FIG. 3, the conductor channel shell 312 of the central pillar 310 defines a hollow central region 314. The memory string 300 also includes a plurality of gates 316 along a length of the central pillar 310. In one example, the plurality of gates 316 are similar to the gates of memory cells 210, 211, 212, and 213 from FIGS. 2A and 2B. In one example, the memory string 300, including the plurality of gates 316, is formed from a plurality of layers, including conductor layers 306 alternating with dielectric layers 308. By patterning and building up conductor layers 306 and dielectric layers 308, a memory device structure is formed that includes conducting elements that are isolated from one another by dielectric.

FIG. 3 further shows a source line 304 and a data line 302 coupled to ends of the conductor channel shell 312. Source line 304 and data line 302 are similar to source line 299 and bit lines (BL0, BL1, BL2) from FIGS. 2A and 2B. In operation, a charge can be stored adjacent to each of the gates 316 in the memory string 300. The presence or absence, or charge level stored adjacent to each of the gates indicates a bit of data that is used to store information in the memory string 300 and more broadly in a memory device such as device 100 from FIG. 1.

As components of memory cells are reduced in size to increase memory density, device performance can be reduced. For example, decreased pitch between layers in a memory string stack can increase interference between adjacent cells in the string. As illustrated in FIG. 3, as gates in the plurality of gates 316 become closer together, they can be more prone to interference with each other.

As noted above, in one example, a the conductor channel shell 312 of the central pillar 310 defines a hollow central region 314. The hollow central region 314 helps to focus conduction within the more narrow cylindrical shell of the conductor channel shell 312. This improves performance of the central pillar 310 as a conductor, and also provides a more confined charge profile for stored charge adjacent to each of the gates 316 in the memory string 300. This can improve performance of memory strings and allow acceptable performance in memory strings with reduced pitch between layers in a memory string stack.

In one example, the conductor channel shell 312 includes polysilicon, although the invention is not so limited. Other conductors such as metals, metallic compounds, or other conductively doped semiconductors are also within the scope of the invention. In one example, the hollow central region 314 is filled with a gas. In one example, an inert gas is used, such as nitrogen or argon. In one example, the hollow central region 314 is filled with a mixture of gasses such as air. In one example, the hollow central region 314 is at least partially pressurized above ambient pressure. In one example, the hollow central region 314 is at least partially evacuated, although one of ordinary skill in the art will recognize that a vacuum is usually a matter of degree, and that a perfect vacuum is impossible to obtain. Pressurizing or evacuating the hollow central region further allows tuning of the dielectric constant (K) in the hollow central region. For example, for any given gas, pressurization or adding gas will raise the dielectric constant, and reducing pressure will lower the dielectric constant, when compared to the same gas at ambient pressure.

In one example the hollow central region 314 is filled with a low dielectric constant (K) material similar to a gas or a vacuum. In one example, the hollow central region 314 is filled with an oxide having a K less than 10. In one example, the hollow central region 314 is filled with an oxide having a K less than 5. In one example, the hollow central region 314 is filled with an oxide having a K less than 3.

In one example some, or all of a length of the central pillar 310 includes a hollow central region. A benefit as described above will be recognized for any fraction of a length of the central pillar 310 that includes a hollow central region 314. In one example, substantially all of a length of the central pillar 310 includes a hollow central region 314.

Figure 4:
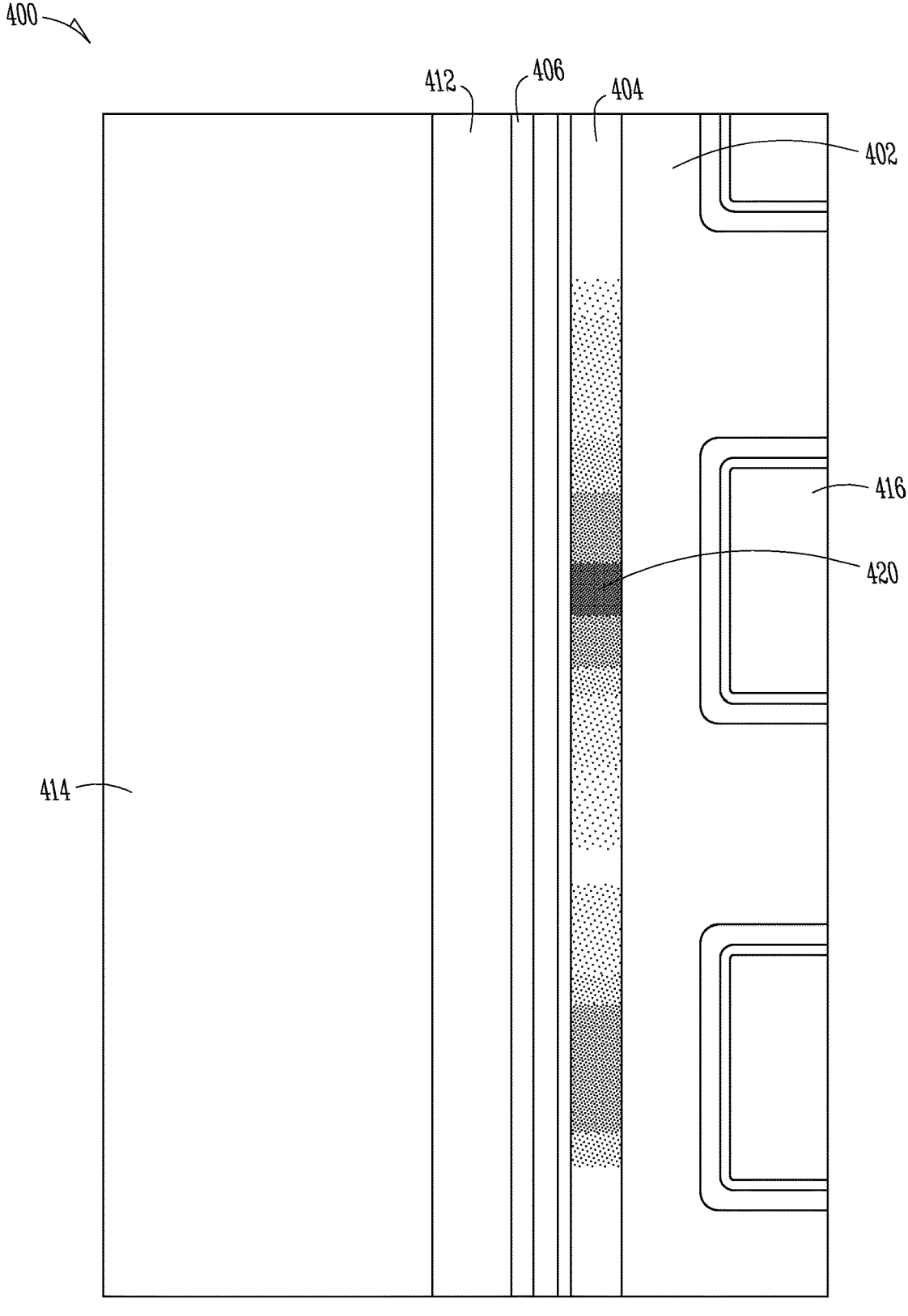
FIG. 4 illustrates a cross section of a portion of a memory string in accordance with some example embodiments.

FIG. 4 shows a close up cross section view of a portion of a memory string 400, similar to memory string 300 from FIG. 3. A plurality of gates 416 are shown adjacent to a conductor channel shell 412 of a central pillar, similar to central pillar 310 of FIG. 3. A hollow central region 414 is also shown in FIG. 4. A charge storage layer 404 is shown located between the plurality of gates 416 and the conductor channel shell 412. In one example, the charge storage layer 404 includes a nitride layer, although the invention is not so limited. In the example of FIG. 4, the charge storage layer 404 is separated from the plurality of gates 416 by a first dielectric layer 402. In the example of FIG. 4, the charge storage layer 404 is separated from the conductor channel shell 412 by a second dielectric layer 406. In one example, the first and/or second dielectric layers 402, 406 include an oxide, however the invention is not so limited.

FIG. 4 further shows simulated data of a stored charge 420 that is localized adjacent to an adjacent gate 416. The focused area of charge 420 storage is facilitated by the conductor channel shell 412 and the hollow central region 414 shown.

Figure 5:
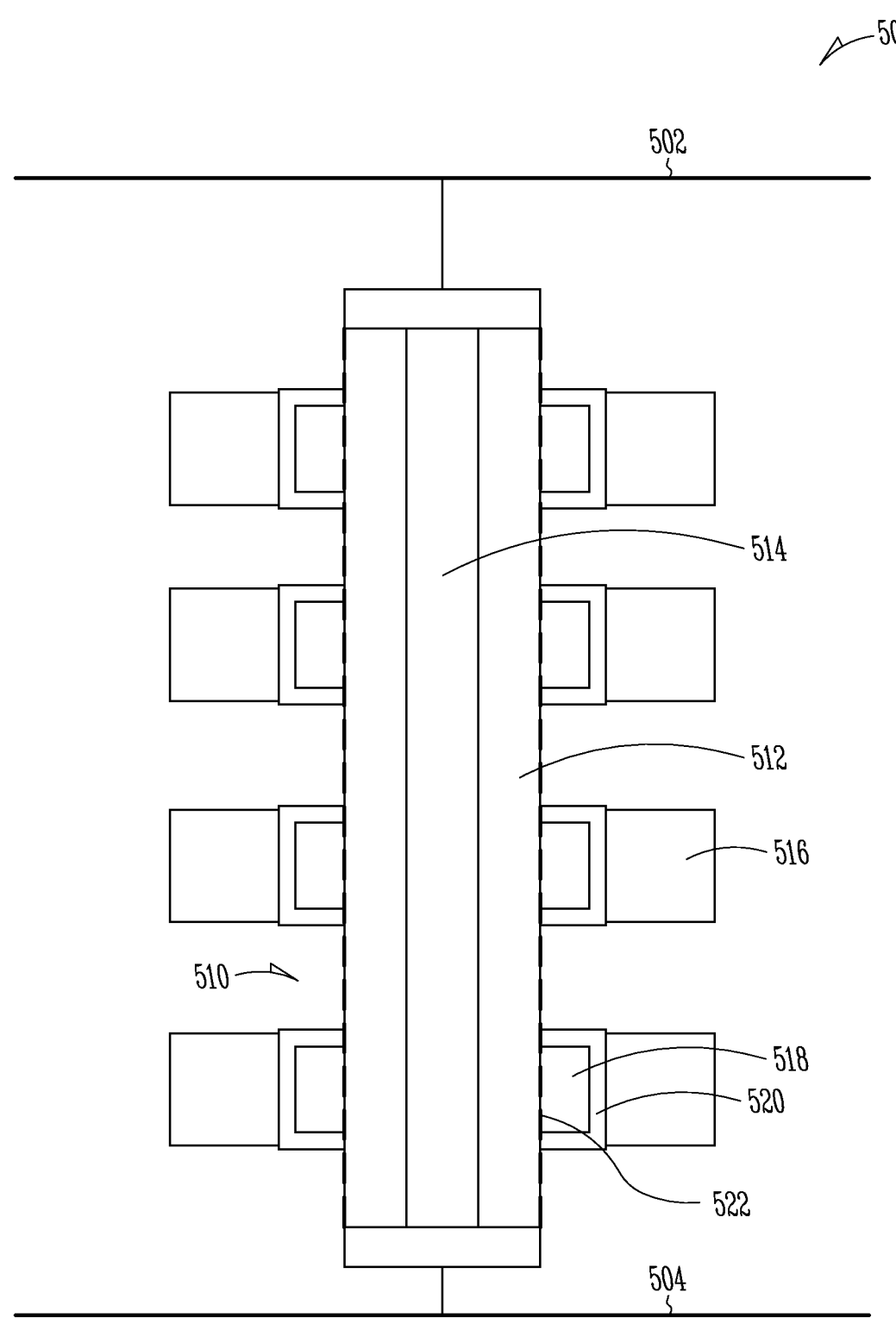
FIG. 5 illustrates another example of a memory string in accordance with some example embodiments.

FIG. 5 shows another example of a memory string 500. The memory string 500 includes a central pillar 510 including a conductor channel shell 512. In the example of FIG. 5, the conductor channel shell 512 of the central pillar 510 defines a hollow central region 514. The memory string 500 also includes a plurality of gates 516 along a length of the central pillar 510. The example of FIG. 5 shows a plurality of floating gates 518 that are separated from the plurality of gates 516 by a first gate oxide 520. The plurality of floating gates 518 are further separated from the conductor channel shell 512 by a second gate oxide 522.

Similar to the examples of FIGS. 3 and 4, in one example, the conductor channel shell 512 includes polysilicon, although the invention is not so limited. Other conductors such as metals, metallic compounds, or other conductively doped semiconductors are also within the scope of the invention. In one example, the hollow central region 514 is filled with a gas. In one example, an inert gas is used, such as nitrogen or argon. In one example, the hollow central region 514 is filled with air. In one example, the hollow central region 514 is at least partially evacuated.

In one example the hollow central region 514 is filled with a low dielectric constant (K) material similar to a gas or a vacuum. In one example, the hollow central region 514 is filled with an oxide having a K less than 10. In one example, the hollow central region 514 is filled with an oxide having a K less than 5. In one example, the hollow central region 514 is filled with an oxide having a K less than 3.

While the gate structure of FIG. 5 is different than the structure of the memory string 300 from FIG. 3, the conductor channel shell 512 of memory string 500 being adjacent to a hollow central region 514 improves performance in a manner similar to the example of FIGS. 3 and 4 discussed above.

FIG. 6 shows a flow diagram of an example method of forming a memory string. In operation 602, a plurality of layers are formed on a semiconductor substrate, the layers including conducting layers and dielectric layers. In operation 604 a vertical hole is formed through at least a portion of the plurality of layers. In operation 606, a central pillar is formed within the vertical hole. In operation 608 a first dielectric layer is formed within the vertical hole, followed by a storage layer over the first dielectric layer. In operation 610, a second dielectric layer is formed over the storage layer, followed by a conducting layer wherein the conducting layer forms a conductor channel shell, the conductor channel shell having a hollow central region.

In one example, the vertical hole of operation 604 is formed by etching, although the invention is not so limited. Other examples include plasma removal, ablation, etc.

In one example, the hollow central region is filled with a gas. Examples of gas, include, but are not limited to, air, nitrogen, argon, or other inert gases. In one example, the hollow central region is at least partially evacuated. Although air or other gasses have a low dielectric constant near 1, a vacuum, by definition, has a dielectric constant of 1, that is lower than a gas.

Figure 7:
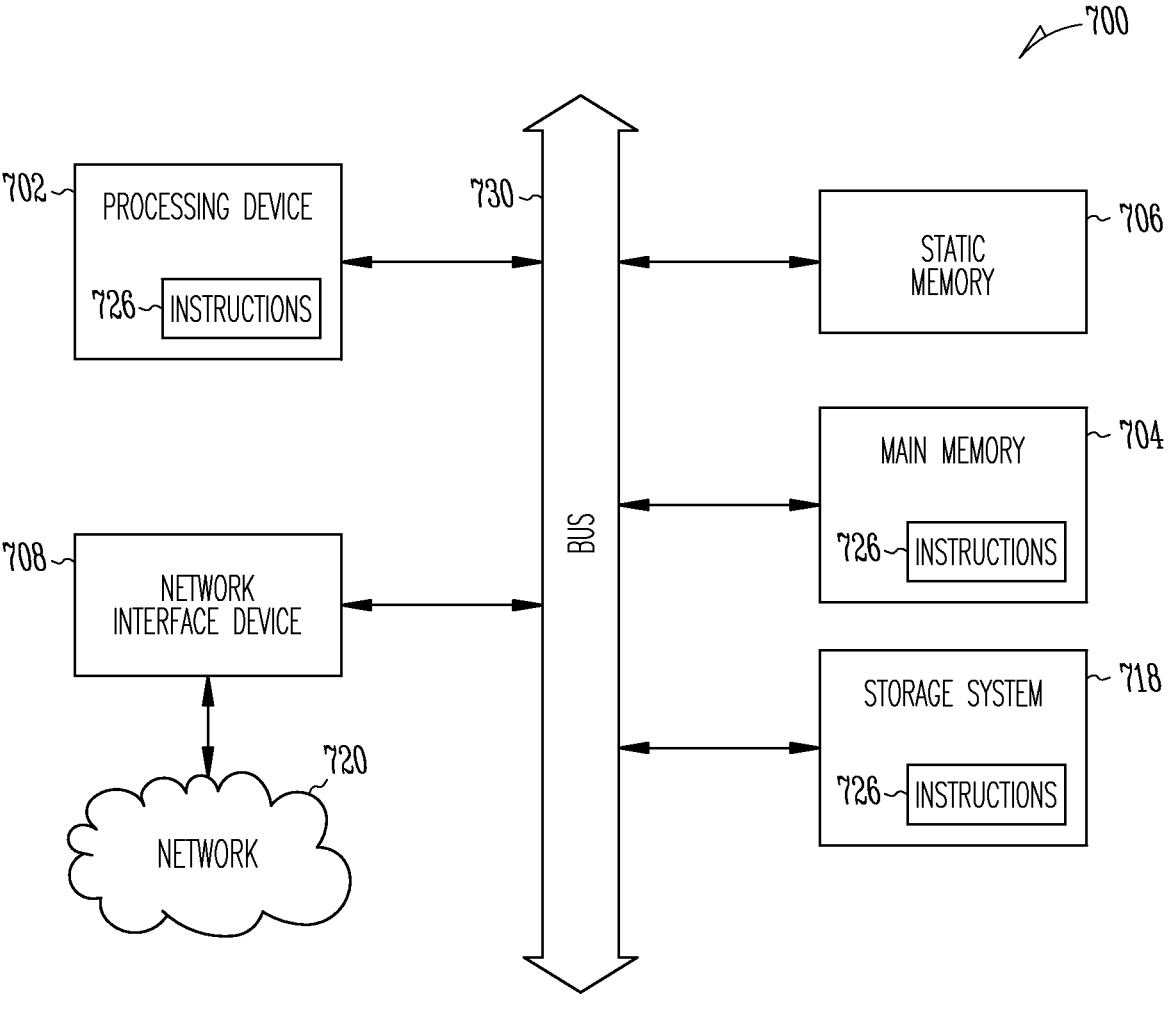
FIG. 7 illustrates an example block diagram of an information handling system in accordance with some example embodiments.

FIG. 7 illustrates a block diagram of an example machine (e.g., a host system) 700 which may include one or more memory devices and/or memory systems as described above. Specifically, one or more memory devices shown in FIG. 7 include a memory string having a conductor channel shell and a hollow central region. As discussed above, machine 700 may benefit from enhanced memory performance from use of one or more of the described memory devices and/or memory systems, facilitating improved performance of machine 700 (as for many such machines or systems, efficient reading and writing of memory can facilitate improved performance of a processor or other components that machine, as described further below.

In alternative embodiments, the machine 700 may operate as a standalone device or may be connected (e.g., networked) to other machines. In a networked deployment, the machine 700 may operate in the capacity of a server machine, a client machine, or both in server-client network environments. In an example, the machine 700 may act as a peer machine in peer-to-peer (P2P) (or other distributed) network environment. The machine 700 may be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic, components, devices, packages, or mechanisms. Circuitry is a collection (e.g., set) of circuits implemented in tangible entities that include hardware (e.g., simple circuits, gates, logic, etc.). Circuitry membership may be flexible over time and underlying hardware variability. Circuitries include members that may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer-readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer-readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time.

The machine (e.g., computer system, a host system, etc.) 700 may include a processing device 702 (e.g., a hardware processor, a central processing unit (CPU), a graphics processing unit (GPU), a hardware processor core, or any combination thereof, etc.), a main memory 704 (e.g., read-only memory (ROM), dynamic random-access memory (DRAM) such as synchronous DRAM (SDRAM) or Rambus DRAM (RDRAM), etc.), a static memory 706 (e.g., static random-access memory (SRAM), etc.), and a storage system 718, some or all of which may communicate with each other via a communication interface (e.g., a bus) 730. In one example, the main memory 704 includes one or more memory devices as described in examples above.

The processing device 702 can represent one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 702 can also be one or more special-purpose processing devices such as an application specific integrated circuit (ASIC), a field programmable gate array (FPGA), a digital signal processor (DSP), network processor, or the like. The processing device 702 can be configured to execute instructions 726 for performing the operations and steps discussed herein. The computer system 700 can further include a network interface device 708 to communicate over a network 720.

The storage system 718 can include a machine-readable storage medium (also known as a computer-readable medium) on which is stored one or more sets of instructions 726 or software embodying any one or more of the methodologies or functions described herein. The instructions 726 can also reside, completely or at least partially, within the main memory 704 or within the processing device 702 during execution thereof by the computer system 700, the main memory 704 and the processing device 702 also constituting machine-readable storage media.

The term "machine-readable storage medium" should be taken to include a single medium or multiple media that store the one or more sets of instructions, or any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media. In an example, a massed machine-readable medium comprises a machine-readable medium with multiple particles having invariant (e.g., rest) mass. Accordingly, massed machine-readable media are not transitory propagating signals. Specific examples of massed machine-readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The machine 700 may further include a display unit, an alphanumeric input device (e.g., a keyboard), and a user interface (UI) navigation device (e.g., a mouse). In an example, one or more of the display unit, the input device, or the UI navigation device may be a touch screen display. The machine a signal generation device (e.g., a speaker), or one or more sensors, such as a global positioning system (GPS) sensor, compass, accelerometer, or one or more other sensor. The machine 700 may include an output controller, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The instructions 726 (e.g., software, programs, an operating system (OS), etc.) or other data are stored on the storage system 718 can be accessed by the main memory 704 for use by the processing device 702. The main memory 704 (e.g., DRAM) is typically fast, but volatile, and thus a different type of storage than the storage system 718 (e.g., an SSD), which is suitable for long-term storage, including while in an "off" condition. The instructions 726 or data in use by a user or the machine 700 are typically loaded in the main memory 704 for use by the processing device 702. When the main memory 704 is full, virtual space from the storage system 718 can be allocated to supplement the main memory 704; however, because the storage system 718 device is typically slower than the main memory 704, and write speeds are typically at least twice as slow as read speeds, use of virtual memory can greatly reduce user experience due to storage system latency (in contrast to the main memory 704, e.g., DRAM). Further, use of the storage system 718 for virtual memory can greatly reduce the usable lifespan of the storage system 718.

The instructions 724 may further be transmitted or received over a network 720 using a transmission medium via the network interface device 708 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.15 family of standards known as Wi-Fi®, IEEE 802.16 family of standards known as WiMax®), IEEE 802.15.4 family of standards, peer-to-peer (P2P) networks, among others. In an example, the network interface device 708 may include one or more physical jacks (e.g., Ethernet, coaxial, or phone jacks) or one or more antennas to connect to the network 720. In an example, the network interface device 708 may include multiple antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding, or carrying instructions for execution by the machine 700, and includes digital or analog communications signals or other intangible medium to facilitate communication of such software.

The above detailed description includes references to the accompanying drawings, which form a part of the detailed description. The drawings show, by way of illustration, specific embodiments in which the invention can be practiced. These embodiments are also referred to herein as "examples". Such examples can include elements in addition to those shown or described. However, the present inventor also contemplates examples in which only those elements shown or described are provided. Moreover, the present inventor also contemplates examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein". Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

In various examples, the components, controllers, processors, units, engines, or tables described herein can include, among other things, physical circuitry or firmware stored on a physical device. As used herein, "processor" means any type of computational circuit such as, but not limited to, a microprocessor, a microcontroller, a graphics processor, a digital signal processor (DSP), or any other type of processor or processing circuit, including a group of processors or multi-core devices.

The term "horizontal" as used in this document is defined as a plane parallel to the conventional plane or surface of a substrate, such as that underlying a wafer or die, regardless of the actual orientation of the substrate at any point in time. The term "vertical" refers to a direction perpendicular to the horizontal as defined above. Prepositions, such as "on," "over," and "under" are defined with respect to the conventional plane or surface being on the top or exposed surface of the substrate, regardless of the orientation of the substrate; and while "on" is intended to suggest a direct contact of one structure relative to another structure which it lies "on" (in the absence of an express indication to the contrary); the terms "over" and "under" are expressly intended to identify a relative placement of structures (or layers, features, etc.), which expressly includes—but is not limited to—direct contact between the identified structures unless specifically identified as such. Similarly, the terms "over" and "under" are not limited to horizontal orientations, as a structure may be "over" a referenced structure if it is, at some point in time, an outermost portion of the construction under discussion, even if such structure extends vertically relative to the referenced structure, rather than in a horizontal orientation.

The terms "wafer" is used herein to refer generally to any structure on which integrated circuits are formed, and also to such structures during various stages of integrated circuit fabrication. The term "substrate" is used to refer to either a wafer, or other structures which support or connect to other components, such as memory die or portions thereof. Thus, the term "substrate" embraces, for example, circuit or "PC" boards, interposers, and other organic or non-organic supporting structures (which in some cases may also contain active or passive components). The following detailed description is, therefore, not to be taken in a limiting sense, and the scope of the various embodiments is defined only by the appended claims, along with the full scope of equivalents to which such claims are entitled.

It will be understood that when an element is referred to as being "on," "connected to" or "coupled with" another element, it can be directly on, connected, or coupled with the other element or intervening elements may be present. In contrast, when an element is referred to as being "directly on," "directly connected to" or "directly coupled with" another element, there are no intervening elements or layers present. If two elements are shown in the drawings with a line connecting them, the two elements can be either be coupled, or directly coupled, unless otherwise indicated.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer-readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMS), read only memories (ROMs), and the like.

To better illustrate the method and apparatuses disclosed herein, a non-limiting list of embodiments is provided here:

Example 1 is a memory string. The memory string includes a central pillar, including a conductor channel shell, the conductor channel shell having a hollow central region. The memory string also includes a plurality of gates along a length of the central pillar, a source line coupled to a first end of the conductor channel shell, and a data line coupled to a second end of the conductor channel shell.

In Example 2, the memory string of Example 1 optionally includes wherein the conductor channel shell includes polysilicon.

In Example 3, the memory string of any one of Examples 1-2 optionally further includes a nitride storage layer between the plurality of gates and the conductor channel shell.

In Example 4, the memory string of any one of Examples 1-3 optionally includes wherein the hollow central region includes a gas.

In Example 5, the memory string of any one of Examples 1-4 optionally includes wherein the hollow central region includes gas at ambient pressure or higher.

In Example 6, the memory string of any one of Examples 1-5 optionally includes wherein the hollow central region includes a gas at a pressure lower than ambient pressure.

In Example 7, the memory string of any one of Examples 1-6 optionally includes wherein the plurality of gates includes metal gates.

In Example 8, the memory string of any one of Examples 1-7 optionally includes wherein the plurality of gates includes polysilicon gates.

In Example 9, the memory string of any one of Examples 1-8 optionally includes wherein the plurality of gates includes floating gates.

Example 10 is an electronic device. The electronic device includes an array of vertical memory cell strings. At least one memory cell string includes a central pillar, including a conductor channel shell, the conductor channel shell having a hollow central region. The at least one memory cell string also includes a plurality of gates along a length of the central pillar, a number of source lines coupled to first ends of conductor channel shells in the array. The at least one memory cell string also includes a number of bit lines coupled to second ends of conductor channel shells in the array, and a number of wordlines coupled to the plurality of gates in the array.

In Example 11, the electronic device of Example 10 optionally includes a processing device coupled to the array of vertical memory cell strings.

In Example 12, the electronic device of any one of Examples 10-11 optionally further includes a network interface device coupled to the array of vertical memory cell strings.

In Example 13, the electronic device of any one of Examples 10-12 optionally includes wherein the conductor channel shell includes polysilicon.

In Example 14, the electronic device of any one of Examples 10-13 optionally further includes a nitride storage layer between the plurality of gates and the conductor channel shell.

In Example 15, the electronic device of any one of Examples 10-14 optionally includes wherein the hollow central region includes a gas.

In Example 16, the electronic device of any one of Examples 10-15 optionally includes wherein the hollow central region includes gas at ambient pressure or higher.

In Example 17, the electronic device of any one of Examples 10-16 optionally includes wherein the hollow central region includes a gas at a pressure lower than ambient pressure.

Example 18 is a method of forming a memory device. The method includes forming a plurality of layers on a semiconductor substrate, the layers including conducting layers and dielectric layers, forming a vertical hole through at least a portion of the plurality of layers, forming a central pillar within the vertical hole, including forming a first dielectric layer within the vertical hole, followed by a storage layer over the first dielectric layer, and forming a second dielectric layer over the storage layer, followed by a conducting layer wherein the conducting layer forms a conductor channel shell, the conductor channel shell having a hollow central region.

Example 19 includes the method of Example 18, optionally including wherein forming the vertical hole includes etching a vertical hole.

Example 20 includes the method of any one of Examples 18-19, optionally including filling the hollow central region with a gas.

Example 21 includes the method of any one of Examples 18-20, optionally including wherein filling the hollow central region with the gas includes filling the hollow central region with nitrogen.

Example 22 includes the method of any one of Examples 18-21, optionally further including at least partially evacuating the hollow central region.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A memory string, comprising:
a central pillar, including a conductor channel shell, the conductor channel shell having a hollow central region that includes an oxide having a dielectric constant less than 3;
a plurality of gates along a length of the central pillar;
a source line coupled to a first end of the conductor channel shell; and
a data line coupled to a second end of the conductor channel shell.

2. The memory string of claim 1, wherein the conductor channel shell includes polysilicon.

3. The memory string of claim 1, further including a nitride storage layer between the plurality of gates and the conductor channel shell.

4. The memory string of claim 1, wherein the plurality of gates includes metal gates.

5. The memory string of claim 1, wherein the plurality of gates includes polysilicon gates.

6. The memory string of claim 1, wherein the plurality of gates includes floating gates.

7. An electronic device, comprising:
an array of vertical memory cell strings, including at least one memory cell string that includes;
a central pillar, including a conductor channel shell, the conductor channel shell having a central region that includes an oxide having a dielectric constant less than 3;
a plurality of gates along a length of the central pillar;
a number of source lines coupled to first ends of conductor channel shells in the array;
a number of bit lines coupled to second ends of conductor channel shells in the array; and
a number of wordlines coupled to the plurality of gates in the array.

8. The electronic device of claim 7, further including a processing device coupled to the array of vertical memory cell strings.

9. The electronic device of claim 7, further including a network interface device coupled to the array of vertical memory cell strings.

10. The electronic device of claim 7, wherein the conductor channel shell includes polysilicon.

11. The electronic device of claim 7, further including a nitride storage layer between the plurality of gates and the conductor channel shell.

12. A method of forming a memory device, comprising:
forming a plurality of layers on a semiconductor substrate, the layers including conducting layers and dielectric layers;
forming a vertical hole through at least a portion of the plurality of layers;
forming a central pillar within the vertical hole, including;
forming a first dielectric layer within the vertical hole, followed by a storage layer over the first dielectric layer;
forming a second dielectric layer over the storage layer, followed by a conducting layer wherein the conducting layer forms a conductor channel shell, the conductor channel shell having a hollow central region; and
filling the hollow central region with an oxide having a dielectric constant less than 3.

13. The method of claim 12, wherein forming the vertical hole includes etching a vertical hole.

* * * * *